United States Patent [19]

Clark

[11] Patent Number: 4,872,846
[45] Date of Patent: Oct. 10, 1989

[54] SOLDER CONTAINING ELECTRICAL CONNECTOR AND METHOD FOR MAKING SAME

[76] Inventor: Thomas C. Clark, 301 N. 17th St., Camp Hill, Pa. 17011

[21] Appl. No.: 222,655

[22] Filed: Jul. 21, 1988

[51] Int. Cl.[4] .............................................. H01R 9/09
[52] U.S. Cl. ...................................... 439/83; 439/874
[58] Field of Search ........................... 439/83, 874–876

[56] References Cited

U.S. PATENT DOCUMENTS

| | | |
|---|---|---|
| 1,188,055 | 6/1916 | Faile . |
| 2,776,008 | 1/1957 | Soderman ............................ 164/118 |
| 3,184,830 | 5/1965 | Lane et al. ........................... 29/155.5 |
| 3,214,827 | 11/1965 | Phohofsky .......................... 29/155.5 |
| 3,462,540 | 8/1969 | Harris, Jr. et al. .................. 174/68.5 |
| 3,525,799 | 8/1970 | Ellis ....................................... 174/84 |
| 3,568,554 | 3/1971 | Wiechec ................................. 83/98 |
| 3,591,922 | 7/1971 | Pardee .................................. 29/626 |
| 3,744,129 | 7/1973 | Dewey, Jr. ...................... 339/117 R |
| 3,822,622 | 7/1974 | Smith et al. ........................... 83/100 |
| 3,834,015 | 9/1974 | Di Renzo .............................. 29/628 |
| 3,864,014 | 2/1975 | Lynch ............................. 339/275 R |
| 3,905,665 | 9/1975 | Lynch et al. ...................... 339/17 L |
| 3,932,934 | 1/1976 | Lynch et al. ......................... 29/628 |
| 3,978,569 | 9/1976 | Cobaugh et al. ............... 29/203 DS |
| 3,997,237 | 12/1976 | White .............................. 339/275 B |
| 4,019,803 | 4/1977 | Schell ............................. 339/275 B |
| 4,120,558 | 10/1978 | Seidler ............................. 339/275 T |
| 4,164,064 | 8/1979 | Reavill ................................. 29/468 |
| 4,203,648 | 5/1980 | Seidler ............................. 339/275 T |
| 4,206,542 | 6/1980 | Reavill ................................. 29/877 |
| 4,216,350 | 8/1980 | Reid ................................... 174/68.5 |
| 4,500,149 | 2/1985 | Mackay ........................... 339/17 C |
| 4,592,617 | 6/1986 | Seidler ............................. 339/275 B |
| 4,641,426 | 2/1987 | Hartman et al. ..................... 29/839 |
| 4,655,517 | 4/1987 | Bryce .................................... 439/83 |
| 4,663,815 | 5/1987 | Hartman et al. ..................... 29/839 |
| 4,678,250 | 7/1987 | Romine et al. ....................... 439/83 |
| 4,679,889 | 7/1987 | Seidler ................................. 439/876 |
| 4,712,721 | 12/1987 | Noel et al. ............................ 439/83 |

FOREIGN PATENT DOCUMENTS 653838  1/1986  Switzerland .

OTHER PUBLICATIONS

The Western Electric Engineer, vol. 19, No. 2 (1975) by T. Y. Chu, J. C. Mollendorf and G. M. Wenger.
IEEE Publication No. 73CHO 777-3EI (1973), Proceedings of the 11th Electrical Insulation Conference, pp. 242-245.
Alphametals, Inc. Document S/M-139 (1979), pp. 7-9.
"Duflo" Header System by Ray Doutrich, Sep. 26, 1986, pp. 2-4.
New Duflo Headers, Dupont Connector Systems (1987).
Vapor-Phase Quickie Headers, Dupont Connector Systems (1986), pp. 2-7.
Surface-Mount Connectors Use Solder Inlays, Circle No. 230, p. 38.
Molex Catalog No. 830, p. 7J.
EPO STD Search Report and Annex File: RS 80717US; RS 80718US.
Standard Search Report DTD May 19, 1989.

Primary Examiner—P. Austin Bradley
Attorney, Agent, or Firm—David L. Smith

[57] ABSTRACT

An electrical connector (10; 10'; 10") includes a housing (11) that defines a solder element receiving channel (20). A solder element (24) is disposed within the channel (20), and a conductive pin (28; 28') is mounted in the housing (11) to pass through the channel (20) and the solder element (24). The channel (20) defines a loading axis (22) angled with respect to the pin (28; 28'), and the channel (20) is shaped to receive the solder element (24) along the loading axis (22) and positively to retain the solder element (24) from movement along the pin (28; 28'). The pin (28; 28') prevents the solder element (24) from moving along the loading axis (22) out of the channel (20). Several methods for assembling such electrical connectors (10; 10'; 10") are described, and in these methods the solder element (24) is moved along the loading axis (22) into the channel (20) within the housing (11), and then the pin (28; 28') is moved into the housing (11) through the pin receiving aperture (16) and through the solder element (24) in order to stake the solder element (24) in place and prevent it from moving out of the channel (20) along the loading axis (22).

16 Claims, 5 Drawing Sheets

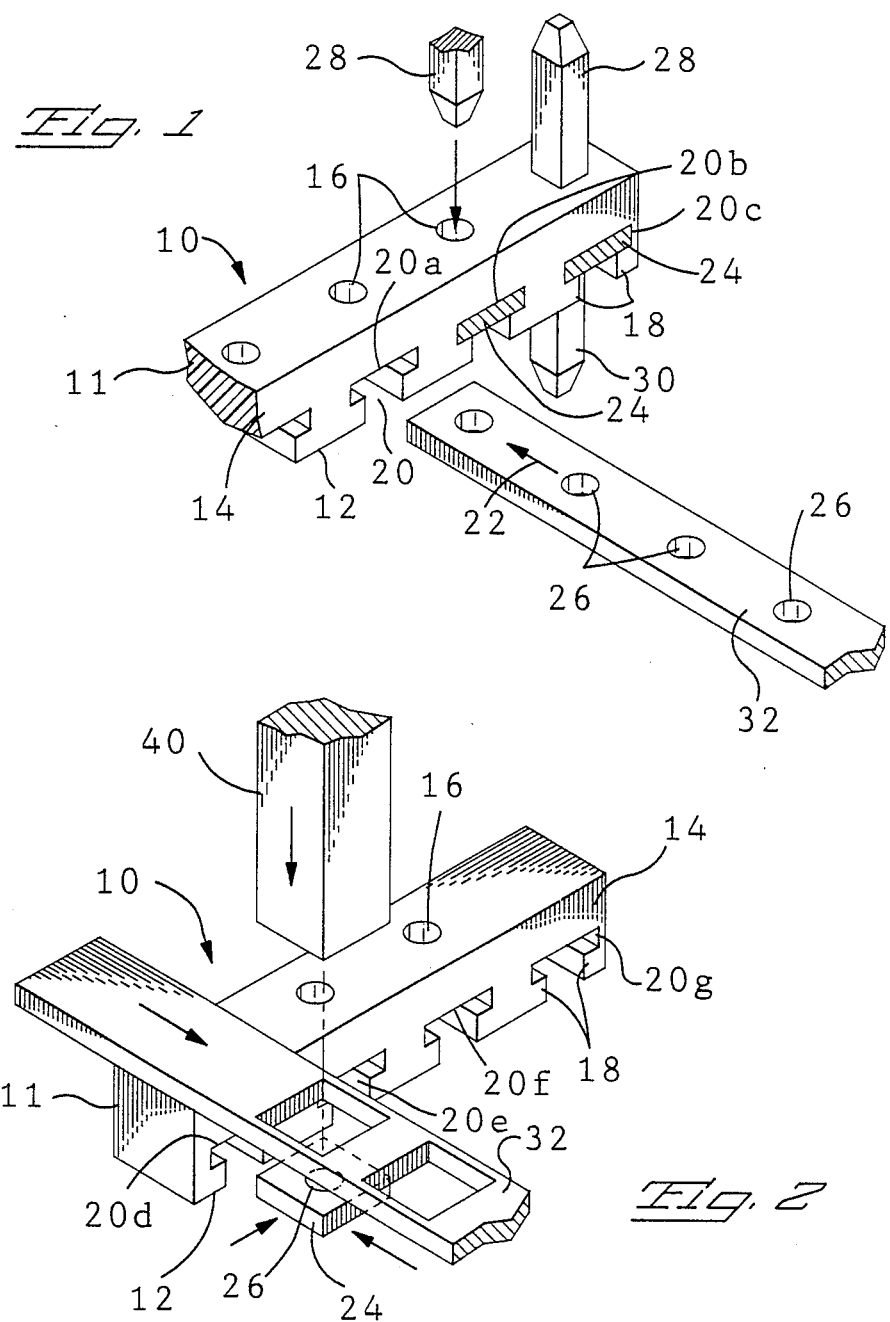

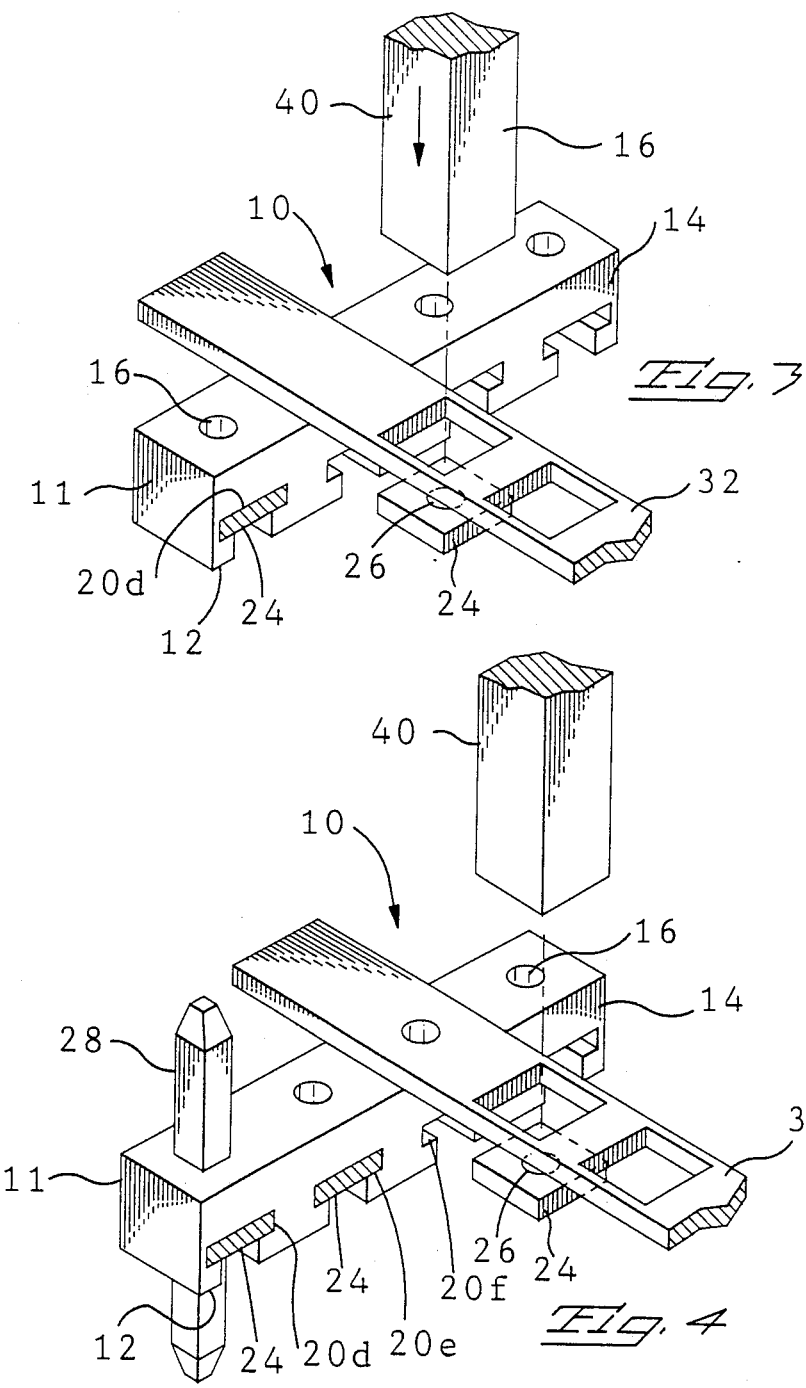

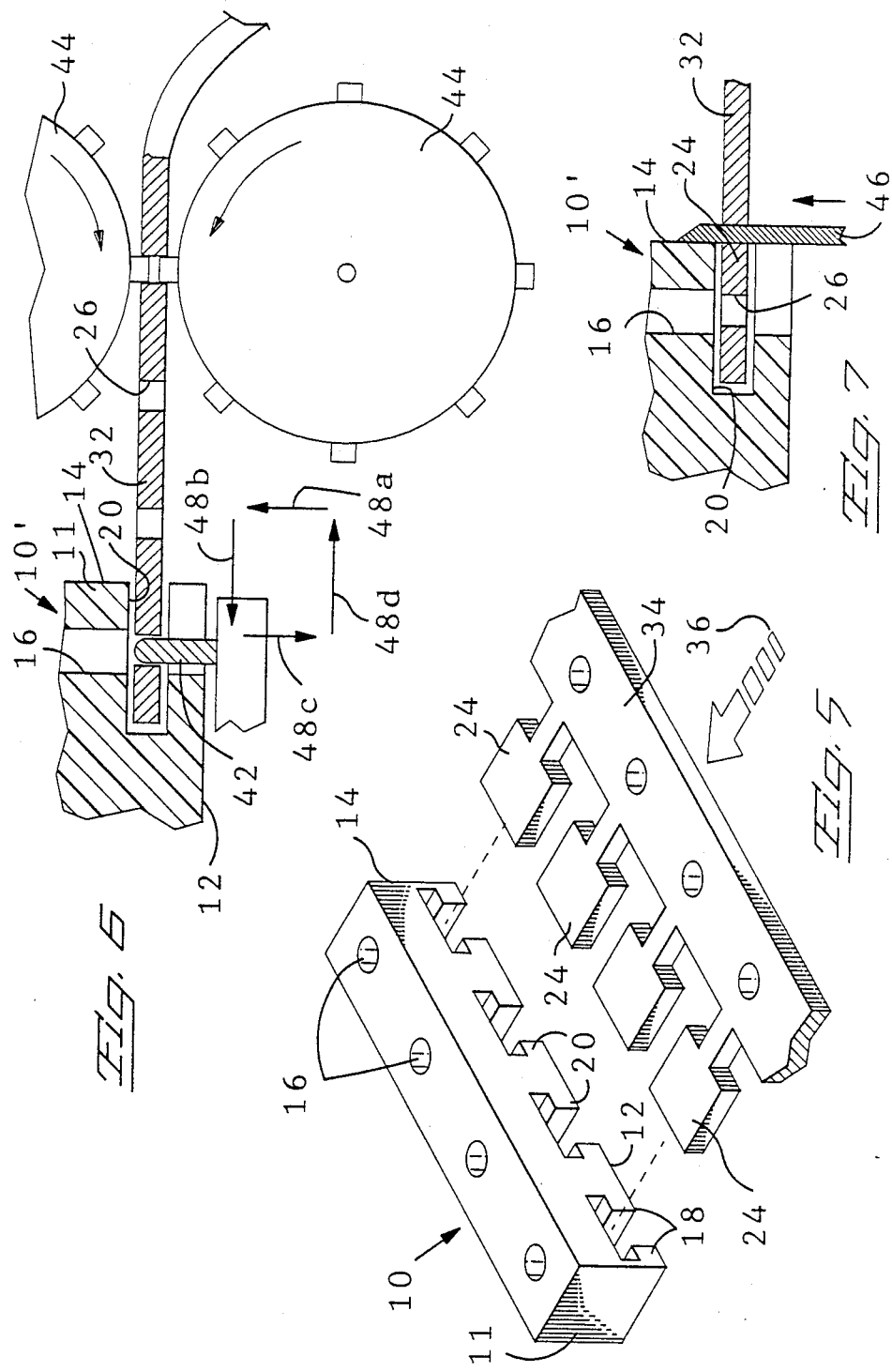

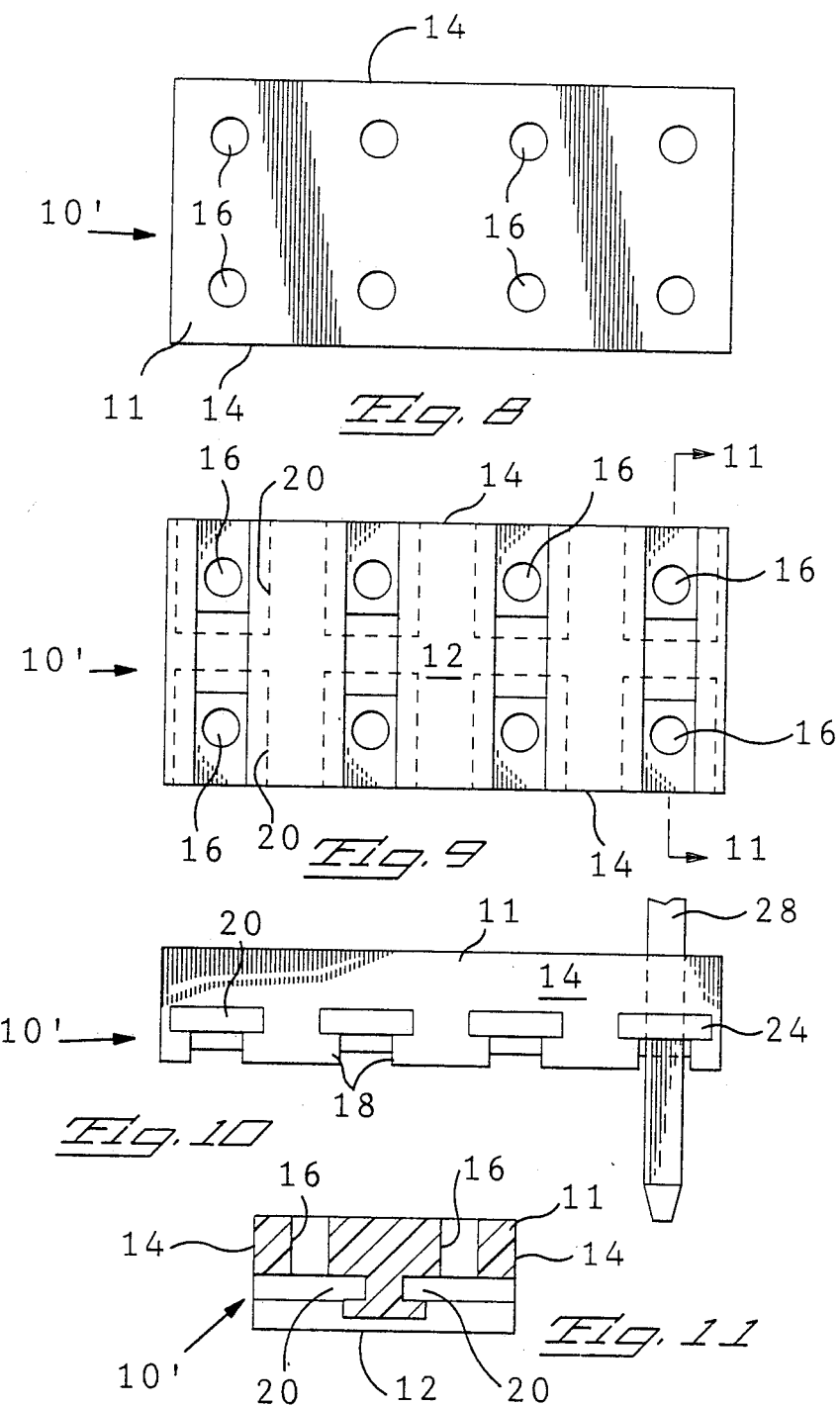

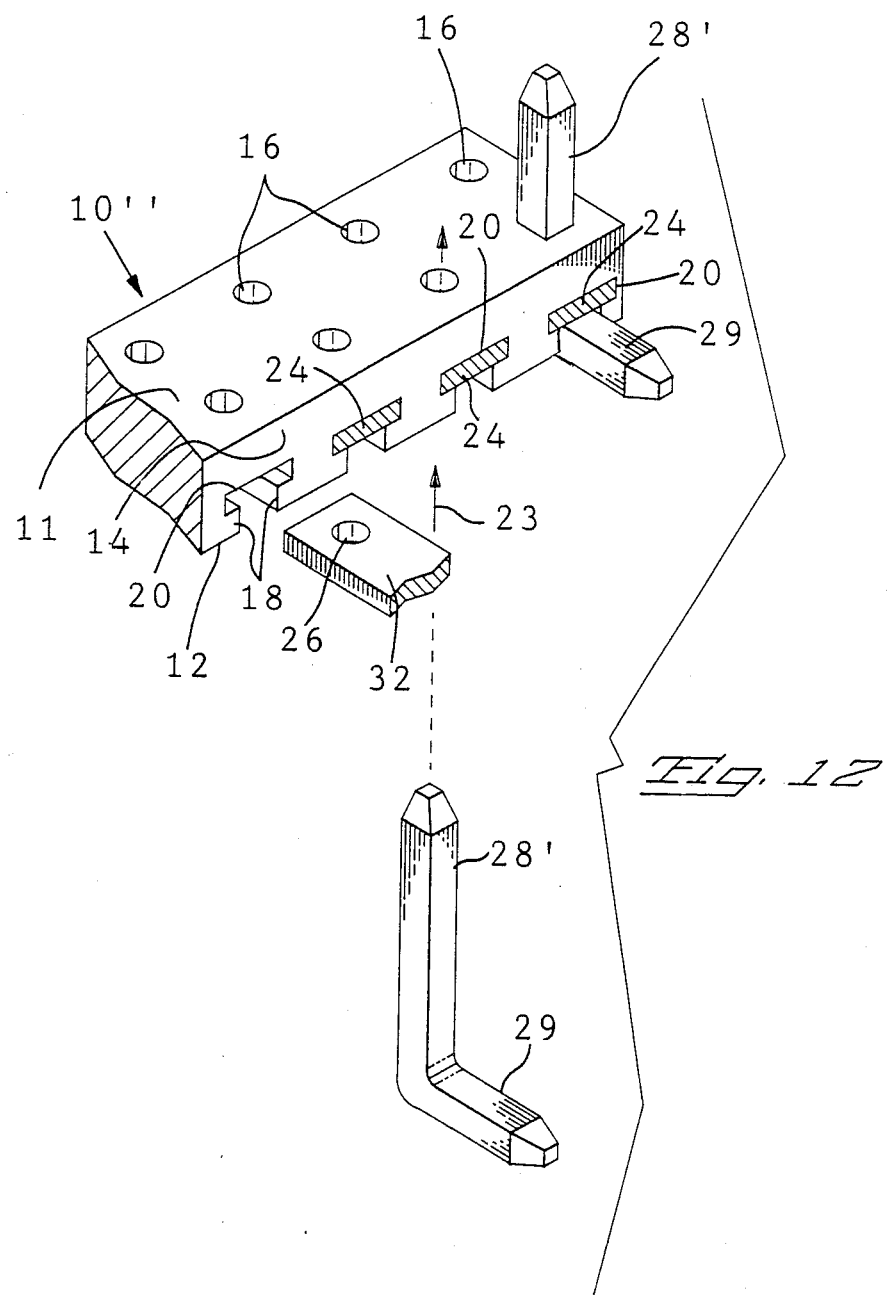

SOLDER CONTAINING ELECTRICAL CONNECTOR AND METHOD FOR MAKING SAME

BACKGROUND OF THE INVENTION

This invention relates to electrical connectors of the type which include reflowable solder elements, and in particular to such connectors having improved means for retaining the solder elements in place and to methods for forming such connectors.

A wide variety of modern electrical connectors and pins include a mass or preform of solder mounted on or adjacent to the pin. After the connector or pin is mounted in place, the solder is melted in a reflow operation in order to form a solder joint. Several approaches have been used to position the mass of solder in place prior to the reflow operation.

One approach is to retain the solder directly on the pin, as for example by crimping the pin around the solder, crimping the solder on the pin, or utilizing a solder or other bond between the pin and the solder. The following U.S. patents illustrate this approach: Lynch U.S. Pat. No. 3,864,014; Lynch U.S. Pat. No. 3,905,665; Cobaugh U.S. Pat. No. 3,978,569; White U.S. Pat. No. 3,997,237; Schell U.S. Pat. No. 4,019,803; Seidler U.S. Pat. No. 4,120,558; Seidler U.S. Pat. No. 4,203,648; Mackay U.S. Pat. No. 4,500,149; Seidler U.S. Pat. No. 4,592,617; and Seidler U.S. Pat. No. 4,679,889.

A second approach is to retain solder preforms on a plate or strip that extends over several pins and is moved along the axes of the pins to position the solder preforms on the pins. See Lane U.S. Pat. No. 3,184,830; Phohofsky U.S. Pat. No. 3,214,827; Pardee U.S. Pat. No. 3,591,922; Reid U.S. Pat. No. 4,216,350; and Proceedings of the 11th Electrical Insulation Conference pp. 242–245 (IEEE Publ. 73CHO-777-3EI, 1973).

A third approach is simply to slide solder preforms along the pins of a connector before the connector is mounted in place. See Harris U.S. Pat. No. 3,462,540; Lynch U.S. Pat. No. 3,932,934; Reavill U.S. Pat. No. 4,206,542; Swiss Pat. No. 653,838; and *The Western Electric Engineer,* Vol. 19, No. 2, (1975). As shown in Lynch '934, retention strips or protrusions on the pins may be used to prevent the solder preforms from sliding off of the pins.

A fourth approach is to hold the mass of solder in the connector housing adjacent the pins. See Hartman U.S. Pat. Nos. 4,641,426 and 4,663,815; Faile U.S. Pat. No. 1,188,055; Ellis U.S. Pat. No. 3,525,799; and Document S/M-139 of Alphametals, Inc. (1979). The Hartman patents disclose reservoirs formed in the connector housing to retain solder masses around the connector pins.

Two problems often associated with solder preforms on connectors relate to retention and reflow of the solder preform. Solder itself is an alloy with virtually no memory or spring properties. For this reason, there is little tendency for a solder preform to retain itself on a connector pin. Of course, if a solder preform falls off of a connector pin, the result is an unacceptable failure to form a proper solder connection.

The second problem is related to the reflow operation. Typically, the insulator body of the connector tends to shield the solder preform from infrared light used to heat the solder to reflow temperatures in infrared soldering systems. For this reason, the insulating housing may prevent or retard the solder preform from reaching the temperature needed.

A need presently exists for an improved electrical connector that positively retains a solder preform in place in the connector housing and prevents the solder preform from falling out of position prior to the reflow operation. The present invention is directed to such an improved electrical connector, and to methods for making such a connector.

SUMMARY OF THE INVENTION

According to this invention, an electrical connector is provided which comprises a housing that defines a receiving channel. A reflowable element such as a solder element is disposed in the channel, and a conductive pin is mounted in the housing to pass through the channel. The channel defines a loading axis angled with respect to the pin, and the channel is shaped to receive the reflowable element along the loading axis and positively to retain the reflowable element against movement along the pin. The pin prevents the reflowable element from moving along the loading axis out of the channel, thereby providing a mechanical interlock that prevents the reflowable element from leaving the channel.

According to the method of this invention, the first step is to provide a reflowable element such as a solder element, a pin, and a housing which defines a channel having a loading axis and a pin receiving aperture passing through the channel and disposed at an angle with respect to the loading axis. This channel is shaped to receive the reflowable element and positively to retain the reflowable element against movement along the direction of the pin receiving aperture. The reflowable element is moved along the loading axis into the channel in the housing, and then the pin is moved into the housing through the pin receiving aperture and through the channel, thereby preventing the solder element from moving out of the channel along the loading axis.

The electrical connector of this invention provides a mechanical interlock which positively retains the reflowable or solder element in place in the housing. The channel in the housing prevents the reflowable element from moving in any direction other than the loading axis of the channel, and the pin passing through the channel prevents the element from moving along the loading axis. As disclosed below, there are a number of distinct approaches that can be used to assemble the connector of this invention.

This invention provides the dual advantages of excellent retention of the solder preform coupled with excellent heating of the solder preform in infrared soldering systems. The second advantage is largely due to the fact that the solder preform can be exposed at the side of the housing, where it can absorb infrared energy readily.

The invention itself, together with further objects and attendant advantages, will best be understood by reference to the following detailed description, taken in conjunction with the accompanying drawings.

BRIEF DESCRIPTION OF THE DRAWINGS

FIG. 1 is a schematic perspective view of a first preferred embodiment of the connector of this invention during a first preferred assembly method.

FIGS. 2, 3 and 4 are schematic perspective views of three stages of a second preferred assembly method.

FIG. 5 is a schematic perspective view of a third preferred assembly method.

FIGS. 6 and 7 are schematic views of a fourth preferred assembly method.

FIGS. 8, 9 and 10 are top, bottom and side views, respectively, of portions of a second preferred embodiment of the connector of this invention.

FIG. 11 is a cross sectional view taken along line 11—11 of FIG. 9.

FIG. 12 is a schematic perspective view of a third preferred embodiment of the connector of this invention during a fifth preferred assembly method.

DESCRIPTION OF THE PREFERRED EMBODIMENTS

Turning now to the drawings, FIG. 1 shows a schematic perspective view of a presently preferred embodiment 10 of the electrical connector of this invention during assembly. As shown in FIG. 1, the connector 10 includes a connector body 11 formed of an insulating material, and this connector body 11 defines a lower surface 12 and two parallel side surfaces 14. The lower surface 12 is intended to be positioned adjacent a printed circuit board or the like when the connector 10 is mounted in position. The connector 10 of FIG. 1 is a pin header.

The connector body 11 defines an array of pin receiving apertures 16 spaced along the length of the connector body 11. Each of the pin receiving apertures 16 is associated with a respective channel 20 formed in the connector body. Each of the channels 20 is bounded at its lower side by a pair of opposed flanges 18. Each of the channels 20 is generally T-shaped in cross section and opens downwardly at the lower surface 12 and also at each of the side surfaces 14. Each of the channels 20 defines a respective loading axis. The arrow 22 is aligned with the loading axis of one of the channels 20a. In this embodiment, each of the channels 20 maintains the same cross sectional shape and dimensions throughout the width of the connector body 11.

The channels 20 each receive a respective reflowable element such as a solder element 24. Each of the solder elements 24 defines a respective opening 26, and the solder elements 24 are sized to move into the channels 20 along the loading axis 22. Once the solder elements 24 are properly positioned within the channels 20, the flanges 18 prevent the solder elements 24 from moving downwardly, toward the lower surface 12. As shown in FIG. 1, the flanges 18 and therefore the channels 20 provide a positive mechanical interlock that prevents the solder elements 24 from moving in any direction other than along the loading axis of the respective channel 20.

As shown in FIG. 1, after the solder elements 24 are positioned within the channels 20, conductive pins or posts 28 are passed through the pin receiving apertures 16 and the openings 26. Once positioned in the body 11, the pins 28 stake the solder elements 24 in place in the channels 20, thereby positively preventing the solder elements 24 from moving along the loading axis 22.

From this description it should be apparent that the pins 28 cooperate with the connector body 11 to immobilize the solder elements 24 in place. The mechanical interlock between the channels 20 and the solder elements 24 prevents the solder elements 24 from moving in any direction other than along the loading axis 22. The pins 28 prevent the solder elements 24 from moving along the loading axis 22. Thus, once the pin 28 is inserted in the pin receiving aperture 16 and the opening 26, there is no chance for the solder element 24 to become dislodged from the connector 10.

FIG. 1 schematically shows three steps in the assembly of the connector 10. First, the solder element 24 is moved into the channel 20a along the loading axis 22. At this stage, the solder element 24 is integral with a solder ribbon 32 stored on a reel (not shown). In the next step (shown at channel 20b), the solder element 24 is severed from the solder ribbon 32. In the third step (as shown at channel 20c), the pin 28 is passed through the pin receiving aperture 16 and the opening 26 to complete the assembly. In FIG. 1 reference numeral 30 is used to indicate the printed circuit board connection end of the pin 28.

In this embodiment, the full width of each of the solder elements 24 is exposed at each side surface 14 of the connector 10. With this arrangement, the connector 10 is well suited for use in infrared reflow systems. In use, the connector 10 is placed on a support such as a printed circuit board (not shown), with the ends 30 of the pins 28 inserted in plated through holes (not shown). The lower surface 12 functions as a standoff. The solder elements 24 are then melted, for example by infrared radiation, and solder flows down the pins 28 to solder the pins 28 in the through holes (not shown). The exposed ends of the solder element 24 are well positioned to absorb infrared energy directly from both sides of the connector 10. Also of importance, the narrow portions of the T-shaped channels beneath the solder elements 24 allow solvents to flow through the connector 10 after the reflow operation to wash away the flux commonly used in soldering.

FIGS. 2–4 schematically illustrate a second preferred method for assembling the connector 10. As shown in FIG. 2, the first step is to pull the ribbon 32 of solder into position beneath a punch 40 and to punch one of the solder elements 24 from the ribbon 32. At this stage, the ribbon 32 and the resulting solder element 24 are aligned with a selected one of the channels 20d. For example, the solder ribbon 32 can be made from flux core solder wire which has been flattened and stored on a reel. The solder element 24 has a width slightly smaller than the width of the wide portion of the T-shaped channel 20d. The solder element 24 is held coplanar and in alignment with the enlarged portion of the T-shaped channel 20d. A pushing mechanism (not shown) then pushes the solder element 24 along the loading axis 22 to place the solder element 24 within the channel 20d.

The connector body is then indexed to the position shown in FIG. 3. FIG. 3 shows the solder element 24 positioned within the channel 20d and a next solder element 24 aligned with the channel 20e.

FIG. 4 shows a third stage in the assembly of the connector 10, in which the connector 10 has been advanced so that the solder ribbon 32 is aligned with the channel 20f. In addition, one of the pins 28 has been installed in the connector 10 by passing it through the pin receiving aperture 16 and the opening 26. The pin 28 positively retains the solder element 24 within the channel 20d in all three axes.

The method of FIGS. 2–4 is especially well suited for high speed assembly systems. Because the solder ribbon 32 is pulled rather than pushed, problems associated with the tendency of a solder ribbon to deform or wander when pushed at high accelerations are avoided. For this reason, the embodiment of FIGS. 2–4 may be preferred over the embodiments of FIGS. 1 and 5–7 for many applications.

FIG. 5 shows a schematic representation of a third preferred method for assembling the connector 10. In the method of FIG. 5, the solder elements 24 are carried on a carrier strip 34, and all of the solder elements 24 (four in this example) are simultaneously inserted into the corresponding channels 20 by moving the carrier strip 34 in the direction shown by the arrows 36. Once all of the solder elements 24 have been positioned properly in the channels 20, pins (not shown in FIG. 5) are installed through the pin receiving apertures 16 to stake the solder elements 24 in place, and the carrier strip 34 is removed. As shown in FIG. 5, it is not essential in all embodiments that the solder elements 24 be provided with preformed openings 26, and in these cases the pins may form the desired openings in the solder elements 24 during assembly.

FIGS. 6 and 7 show steps in a fourth preferred method for assembling the connector 10. In the method of FIGS. 6 and 7, a pair of punch wheels 44 are provided to punch the openings 26 in the solder ribbon 32, and to advance the solder ribbon 32 in an indexed manner. A ribbon feeding finger 42 is provided which is moved in a four step cycle as shown in FIG. 6. In the first step the ribbon finger 42 moves along the direction of the arrow 48a to engage the ribbon finger 42 in one of the openings 26. In the second step the ribbon finger moves as shown by the arrow 48b to pull the solder strip 32 into the channel 20. Simultaneously, the punch wheels 44 are indexed so as not to stretch the ribbon 32. In the third step, the ribbon finger 42 moves along the direction of the arrow 48c to retract the ribbon finger 42 from the opening 26. In the fourth step indicated by the arrow 48d, the ribbon finger 42 returns to its original position. FIG. 7 shows the next stage in this assembly method, in which a blade 46 is passed next to the housing to sever the ribbon 32 and leave a discrete solder element 24 in the channel 20. A conductive pin (not shown) is then mounted in the housing as described above to immobilize the solder element 24 in the channel 20.

The method of FIGS. 6 and 7 is illustrated in connection with a modified form 10' of the connector of this invention which includes multiple parallel rows of pins 28. FIGS. 8–10 are top, bottom and side views, respectively, of the housing 11 of one of these modified connectors 10'. FIG. 11 is a cross section of the modified connector 10' taken along line 11—11 of FIG. 9. In the modified connector 10' as shown in FIGS. 8–11, the same reference numerals are used as in FIGS. 1–7 for corresponding elements. As before, each of the pin receiving apertures 16 is aligned with a respective T-shaped channel 20. However, since in this case there are two rows of pin receiving apertures 16, each of the channels 20 extends only partly into the connector body 11. Thus, each of the T-shaped channels 20 is closed ended, as shown in dotted lines in FIG. 9 and in cross section in FIG. 11. Any of the assembly methods described above can be used to insert solder elements 24 in the channels 20. As before, the pins 24 stake the solder elements 24 in place in the channels 20.

All of the connectors discussed above utilize pins adapted for insertion into plated through holes, and in all of the assembly methods discussed above the pins are inserted into the pin receiving apertures 16 from above connector body 11. However, this invention is not so limited and other types of pins can be used. Furthermore, the pins can be inserted into the apertures 16 either from above or below connector body 11, depending on the pin configuration and application.

FIG. 12 shows a third preferred embodiment 10" of the connector of this invention that includes a modified pin 28'. The pin 28' includes a mounting end 29 adapted to be surface mounted to a support surface such as a printed circuit board. The connector 10" is otherwise similar to the connector 10' of FIGS. 8–11.

As shown in FIG. 12, the connector 10" is assembled in a manner similar to that described above in connection with FIG. 1. However, in the method of FIG. 12 the pin 28' is inserted into the body 11 from below, as shown at 23. Thus, the upper end of the pin 28' passes first through the opening 26 in the solder element 24, and then through the pin receiving aperture 16 of the body 11.

Connector 10" shown in FIG. 12 is a dual row connector with mounting ends 29 of pins 28' of each row of pins extending laterally toward a respective side surfaces 14 of the housing. For a single row connector, the mounting ends 29 of pins 28' would extend alternately toward side surfaces 14.

In use, the assembled connector 10" is secured in place by positioning the connector 10" in place with the mounting ends 29 of the pins 28' on respective conductive pads (not shown). Any suitable means can be used to hold the connector temporarily in place, such as the conventional board locks shown in U.S. Pat. Nos. 4,477,142 (Cooper, et al.), 4,717,219 (Franz, et al.) and 4,679,883 (Assini, et al.). Then the solder elements 24 are heated to melt the solder elements and cause solder to travel out of the channels 20, along the pins 28' to the mounting ends 29 to secure the mounting ends 29 to conductive pads (not shown) on a printed circuit board (not shown).

Simply by way of example, the following illustrative dimensions are provided. In this preferred embodiment the T-shaped channel 20 is 0.070" wide at the wide portion of the T-shaped channel, and 0.040" wide at the narrow portion of the T-shaped channel 20. In this embodiment the solder elements 24 are approximately 0.068" wide. This provides an adequate tolerance to allow easy insertion of the solder elements 24 into the channels 20. With these dimensions, the flanges 18 support approximately 0.014" of the solder elements 24 on each side of the channel.

In this example, the cross sectional dimensions of the pin 28 are 0.025 inch by 0.025 inch, and each of the openings 26 is 0.027 inch in diameter. This geometry has been found to provide adequate contact between the solder preform 24 and the pin 28 to ensure that solder will flow along the pin 28 during the reflow operation to form a reliable solder bond between the pin and a plated through hole of a printed circuit board. The thickness of the solder preform 24 is 0.017 inches, and the height of the wide portion of the T-shaped channel 20 (measured along the pin 28) is 0.020 inches. The overall height of the channel 20 is 0.035 inches.

The housing 11 can be made of any suitable insulating material. One suitable material is the liquid crystal polymer thermoplastic sold under the tradename Vectra A-130 (Celanese Corporation). The pin 28 can be formed of any suitable solder-wettable conductive material of adequate strength, of solid or formed construction. Although a square cross section has been shown, circular or other shapes may also be used. The pin should preferably be sized to form a friction fit with the housing in the pin receiving aperture 16.

The solder element 24 can be formed of any suitable solder alloy, such as a 60/40 or 63/37 tin-lead alloy. A flux such as a mildly activated rosin may be included in the element 24, or alternately flux may be added later.

Of course, this invention is not limited to use with headers as illustrated in the drawings, but can be used with a wide variety of electrical connectors, including a wide range of connectors for both surface mount and through hole mount applications, connectors with integrally mounted electrical components such as transformers, edge connectors, socket connectors, and the like. Also, this invention is not limited to use with T-shaped channels, but can also be used with L-shaped channels having only a single flange 18.

Solder elements have been used above as examples of suitable reflowable elements, and as pointed out above, a variety of solders can be used. Depending upon the application, other metals and conductive adhesives can be used for a reflowable element, as long as the chosen material (1) has sufficient rigidity to be retained by the channel and pin structure described above, and (2) can be caused to reflow down the pin to form an electrical connection. Of course, this invention is not limited to use with square reflowable elements. Rather a wide variety of shapes can be used, including discs, washers and tori.

Conventional materials can be used for the connector housing, the pins, and the solder elements, and this invention is not restricted to the particular materials described above. Those skilled in the art are well versed in the selection of suitable materials, depending upon the temperature and structural requirements of the particular application. Of course, it should be understood that a wide range of changes and modifications can be made to the preferred embodiments described above. It is therefore intended that the foregoing description be regarded as illustrative rather than limiting, and that it be understood that it is the following claims, including all equivalents, which are intended to define the scope of this invention.

I claim:

1. An electrical connector comprising:
a housing which defines a receiving channel;
a reflowable element disposed within the channel;
a conductive pin mounted in the housing and passing through the channel;
said channel defining a loading axis angled with respect to the pin such that the loading axis is non-parallel to the pin;
said channel shaped to receive the reflowable element along the loading axis and positively to retain the reflowable element from movement along the pin;
said pin preventing the reflowable element from moving along the loading axis out of the channel.

2. The connector of claim 1 wherein the channel is T-shaped in cross section.

3. The connector of claim 1 wherein the housing and pin form a header.

4. The connector of claim 1 wherein the reflowable element comprises solder.

5. The connector of claim 1 wherein the pin is shaped for insertion into a through hole.

6. The connector of claim 1 wherein the pin is shaped for surface mounting.

7. The connector of claim 1 wherein the pin passes through an opening formed in the reflowable element.

8. The connector of claim 7 wherein the housing defines a lower surface and at least one side surface, wherein the pin defines a printed circuit board connection end situated adjacent to the lower surface, wherein the channel and the loading axis pass through the side surface, and wherein the channel is open to the lower surface.

9. The connector of claim 8 wherein the housing defines at least one flange at the lower surface that forms one edge of the channel, said flange shaped to positively retain the reflowable element in the channel against movement along the pin.

10. An electrical connector comprising:
a housing that defines a bottom surface adapted to rest on a mounting surface and at least one side surface adjacent to the bottom surface;
at least one channel formed in the housing, said channel opening out at both the bottom and side surfaces and defining a loading axis passing through the side surface, said channel defining a first, larger cross sectional width within the housing and a second, smaller cross sectional width adjacent the bottom surface;
a solder element disposed in the channel and having a third width smaller than the first width and greater than the second width such that the solder element is positively retained in the channel against movement out of the channel toward the bottom surface; and
a pin mounted in the housing to pass through the solder element, said pin oriented non-parallel to the loading axis to prevent the solder element from moving along the loading axis out of the channel.

11. The connector of claim 10 wherein the channel is T-shaped in cross section.

12. The connector of claim 10 wherein the housing and pin form a header.

13. The connector of claim 10 wherein the at least one side surface comprises two spaced parallel side surfaces, wherein the channel opens out at both side surfaces, and wherein the solder element is exposed at both side surfaces.

14. The connector of claim 10 wherein the channel opens out at only a first side surface and the bottom surface, and wherein the solder element is exposed at only the first side surface and the bottom surface.

15. The connector of claim 10 wherein the pin is shaped for insertion into a through hole.

16. The connector of claim 10 wherein the pin is shaped for surface mounting.

* * * * *